United States Patent
Nakakita et al.

(10) Patent No.: US 7,646,245 B2
(45) Date of Patent: Jan. 12, 2010

(54) AMPLIFIER

(75) Inventors: Masato Nakakita, Osaka (JP); Makoto Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/876,285

(22) Filed: Oct. 22, 2007

(65) Prior Publication Data

US 2008/0129387 A1 Jun. 5, 2008

(30) Foreign Application Priority Data

Oct. 23, 2006 (JP) .............................. 2006-287752

(51) Int. Cl.
*H03F 3/10* (2006.01)
(52) U.S. Cl. ..................................................... 330/279
(58) Field of Classification Search ................. 330/279, 330/129–141

See application file for complete search history.

(56) References Cited

U.S. PATENT DOCUMENTS 5,196,806 A * 3/1993 Ichihara ....................... 330/137
5,298,868 A * 3/1994 Nagano ........................ 330/129
5,656,972 A * 8/1997 Norimatsu ................... 330/129

FOREIGN PATENT DOCUMENTS

JP 7-34534 4/1995

* cited by examiner

*Primary Examiner*—Robert Pascal
*Assistant Examiner*—Khiem D Nguyen
(74) *Attorney, Agent, or Firm*—Hamre, Schumann, Mueller & Larson, P.C.

(57) ABSTRACT

An amplifier includes: a single-stage or multiple-stage variable gain amplifier that amplifies an input signal with a controlled gain; a AGC control circuit that detects the peak level of a signal outputted from the variable gain amplifier in the final stage, converts the resultant signal to a digital signal, and outputs an AGC control signal for controlling the gain of the variable gain amplifier based on the converted digital signal; an EVR control circuit that outputs an EVR control signal according to a signal of setting an attenuation value or an amplification value for EVR inputted from an electronic variable resistor control terminal; and a gain control circuit that controls the gain of the variable gain amplifier in accordance with at least one of the AGC control signal and the EVR control signal. The occurrence of "popping" sounds caused by differences in DC voltage due to switching between an AGC circuit and an electronic variable resistor circuit can be suppressed.

11 Claims, 5 Drawing Sheets

AMPLIFIER

BACKGROUND OF THE INVENTION

1. Field of the Invention

The present invention relates to an amplifier that includes an AGC circuit and an electronic variable resistor circuit as built-in elements, and in particular to an amplifier having a configuration in which a variable gain amplifier is shared for composing the AGC circuit and the electronic variable resistor.

2. Description of Related Art

The miniaturization of electronic components and reduction of the number of components used in portable devices such as digital still cameras and digital video cameras is considered to be of importance in the miniaturization and reduction of weight for such devices.

In an AGC (Automatic Gain Control) circuit used for improving the distortion characteristics of a handled signal, by converting a detection signal obtained by detecting a level of an output signal to a digital signal, it becomes possible to eliminate an external component. On the other hand, there are also many cases where an EVR (Electronic Variable Resistor) function for gain switching is provided in products that handle audio signals.

FIG. 6 illustrates an audio amplifier that has an AGC circuit and an electronic variable resistor circuit, as disclosed in JP H7-34534A. A signal inputted from an input terminal 1 is amplified by a variable gain amplifier 31 and outputted from an output terminal 2. Signals outputted from a gain control circuit 32 and a detection circuit 33 are supplied to the variable gain amplifier 31. A control signal is supplied to the gain control circuit 32 from a control signal input terminal 30 via a switch 34, and the electronic variable resistor circuit is configured thereby. The signal outputted from the variable gain amplifier 31 is supplied to the detection circuit 33 via a switch 35 and a rectifier circuit 36. Furthermore, a smoothing capacitor 37 is connected between the point at which the rectifier circuit 36 and the detection circuit 33 are connected and a ground, and the AGC circuit is configured thereby.

The AGC circuit and the electronic variable resistor circuit are both circuits that realize a function for controlling the gain of the amplifier. When the level of the input signal fluctuates, the AGC circuit detects the output signal level through the detection circuit and adjusts the gain of the variable gain amplifier based on the detected signal so that the output signal achieves a desired level. On the other hand, the electronic variable resistor circuit does not need to control the gain of the variable gain amplifier as long as the set gain is not altered.

For this reason, when an AGC circuit and an electronic variable resistor circuit are included within the same semiconductor integrated circuit, oftentimes they conventionally have been composed of individual elements, which has led to an increase in the scale of the circuit. Moreover, control of the electronic variable resistor circuit has been performed through ON/OFF selection of plural variable gain amplifiers, which, when used in audio applications, has been a cause of "popping" sounds due to DC voltage fluctuations in the output voltage.

Furthermore, in the example of conventional art illustrated in FIG. 6, the amplifier is configured so that the AGC circuit and the electronic variable resistor circuit share the variable gain amplifier, and the amplifier utilizes the smoothing capacitor 37, which is normally implemented as an external component, to detect the signal outputted from the AGC circuit; causing an obstacle in the reduction of the number of components in the system as a whole.

SUMMARY OF THE INVENTION

Having been conceived to solve the aforementioned conventional problems, it is an object of the present invention to include an AGC circuit and an electronic variable resistor circuit within a semiconductor integrated circuit; to share the variable gain amplifier that provides a common function, thereby reducing the scale of the circuit; and to suppress the occurrence of stepped fluctuations in DC voltage due to a gain change caused by the operation of the electronic variable resistor.

To solve the abovementioned problems, an amplifier according to the present invention includes: a single-stage or multiple-stage variable gain amplifier that amplifies an input signal with a controlled gain; a AGC control circuit that detects the peak level of a signal outputted from the variable gain amplifier in the final stage, converts the resultant signal to a digital signal, and outputs an AGC (Automatic Gain Controller) control signal for controlling the gain of the variable gain amplifier based on the converted digital signal; an EVR control circuit that outputs an EVR (Electronic Variable Resistor) control signal according to a signal of setting an attenuation value or an amplification value for EVR inputted from an electronic variable resistor control terminal; and a gain control circuit that controls the gain of the variable gain amplifier in accordance with at least one of the AGC control signal and the EVR control signal.

DETAILED DESCRIPTION OF THE INVENTION

Figure 1:
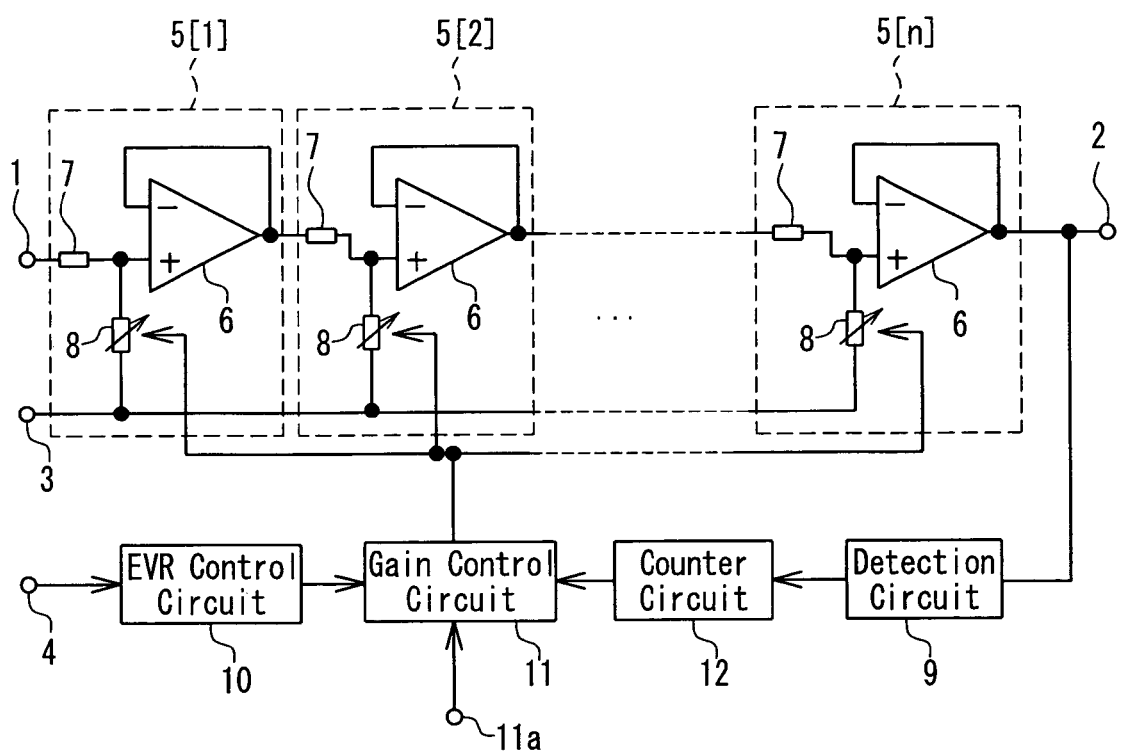
FIG. 1 is a block diagram illustrating an amplifier that includes an AGC and an electronic variable resistor according to a first embodiment of the present invention.

An amplifier according to the present invention configured as described above includes an AGC and an electronic variable resistor that share a variable gain amplifier, so that regardless of whether the AGC function of the variable register function is set, a signal always passes through the same amplification circuits between the input terminal and the output terminal, while simply the gain changes. Therefore it is possible to suppress DC offset (in the case of audio applications, popping sounds).

Furthermore, sharing of circuit elements allows the scale of the circuit to be reduced to a size smaller than is possible when the AGC and electronic variable resistor are configured individually. Furthermore, handling the signal for detecting the output level as a digital signal allows the external smoothing capacitor to be eliminated from the configuration.

The following aspects of the amplifier according to the present invention are possible, based on the aforementioned configuration.

That is, the gain control circuit may switch between the AGC control signal and the EVR control signal in accordance with a switching control signal supplied from outside of the circuit, thereby controlling the gain of the variable gain amplifier in accordance with any one of the signals.

Also the gain control circuit may include a signal converter that converts the AGC control signal to a gain control signal for controlling the gain of the variable gain amplifier; and an adder that adds the gain control signal outputted from the signal converter and the EVR control signal, and the gain of the variable gain amplifier may be controlled based on a signal obtained by adding the gain control signal and the EVR control signal.

Moreover, the AGC control circuit may include a detection circuit that detects the peak level of a signal outputted from the variable gain amplifier in the final stage and converts the resultant signal to a digital signal; and a counter circuit that outputs the AGC control signal based on the digital signal outputted from the detection circuit.

Furthermore, the variable gain amplifier may include an operational amplifier in which a non-inverting input terminal is supplied with the input signal via a resistor; and a variable resistor that is connected at one terminal to the non-inverting input terminal and is connected at the other terminal to a reference voltage terminal. And an inverting input terminal of the operational amplifier is connected to an output terminal thereof, so that the gain is controlled by the ratio of resistance values of the resistor and the variable resistor.

In this configuration, the variable resistor may be composed of a series circuit of plural resistors; and switching transistors each of which is connected at one terminal to one of nodes between the respective resistors of the series circuit and is connected at the other terminal to one end of the series circuit, and the gain control circuit controls switching of ON and OFF of each of the switching transistors. It is preferable that the back gates of the switching transistors may be grounded via a diode.

Moreover, the variable gain amplifier may include: an operational amplifier in which an inverting input terminal is supplied with the input signal via a resistor and a non-inverting input terminal is connected to a reference voltage terminal; and a variable resistor that is connected between the inverting input terminal and an output terminal, so that the gain is controlled by the ratio of resistance values of the resistor and the variable resistor.

In this configuration, the variable resistor may include: a series circuit of plural resistors; and switching transistors each of which is connected at one terminal to one of nodes between the respective resistors of the series circuit and is connected at the other terminal to one end of the series circuit, and the gain control circuit controls switching of ON and OFF of each of the switching transistors. It is preferable that, the back gates of the switching transistors may be grounded via a diode.

Moreover, the variable gain amplifier may include: an operational amplifier in which the input signal is inputted to an inverting input terminal via a resistor and a non-inverting input terminal is connected to a reference voltage terminal; and a variable resistor that is connected between the inverting input terminal and an output terminal, so that the gain is controlled by the ratio of resistance values of the resistor and the variable resistor.

In this configuration, the variable resistor may include: a series circuit of plural resistors; and switching transistors connected between respective nodes between the resistors of the series circuit and one end of the series circuit, and the gain control circuit may controls switching of ON and OFF of each of the switching transistors. It is preferable that the back gates of the switching transistors are grounded via a diode.

Moreover, plural variable gain amplifiers may be connected in a cascade arrangement, and the gain of each of the variable gain amplifiers can be controlled independently.

Hereinafter, embodiments of the present invention will be described with reference to the drawings.

First Embodiment

FIG. 1 is a block diagram illustrating an amplifier according to a first embodiment of the present invention. Plural variable gain amplifiers 5[1], 5[2], . . . 5[n] are connected in a cascade arrangement between an input terminal 1 and an output terminal 2. Each of the variable gain amplifiers 5[1], 5[2], . . . 5[n] is composed of an operational amplifier 6, a resistor 7, and a variable resistor 8.

The input terminal 1 is connected to a non-inverting input terminal of the operational amplifier 6 via the resistor 7 of the variable gain amplifier 5[1]. The output terminal of the operational amplifier 6 is connected to an inverting input terminal, and also is connected to a non-inverting input terminal of the operational amplifier 6 of the variable gain amplifier 5[2] via the resistor 7 of the variable gain amplifier 5[2]. The output terminal of the operational amplifier 6 of the variable gain amplifier 5[2] is connected to an inverting input terminal, and is also connected to a non-inverting input terminal of the operational amplifier of the variable gain amplifier in the following stage, via a resistor. Thus, the operational amplifiers of each stage are connected in the same manner, and the output terminal of the operational amplifier of the previous stage is connected to the non-inverting input terminal of the operational amplifier 6 of the variable gain amplifier 5[n], which is in the final stage, via the resistor 7. The output terminal of the operational amplifier 6 of the variable gain amplifier 5[n] is connected to an inverting input terminal, and also is connected to the output terminal 2, and further connected to a detection circuit 9.

The non-inverting input terminals of the operational amplifiers 6 composing the variable gain amplifiers 5[1], 5[2], . . . 5[n] of each stage are each connected to one end of the variable resistors 8. The other end of each of the variable resistors 8 is connected to a reference voltage terminal 3.

An EVR (electronic variable resistor) control terminal 4 is connected to an EVR control circuit 10. The EVR control circuit 10 supplies, to a gain control circuit 11, a control signal according to an attenuation value or an amplification value supplied from the electronic variable resistor. The resistance values of each of the variable resistors 8 are controlled by the output of the gain control circuit 11, and the gain of the variable gain amplifiers 5[1], 5[2], . . . 5[n] is controlled thereby. In this manner, the electronic variable resistor function is effected by the gain control circuit 11 controlling the gain of the variable gain amplifiers 5[1], 5[2], . . . 5[n] based on the control signal from the EVR control circuit 10.

The detection circuit 9 detects a level of the output from the operational amplifier 6 in the final stage, and supplies the resultant signal to a counter circuit 12. The counter circuit 12 converts the detection output signal to attack and recovery times preset in the AGC, so as to generate a control signal for adjusting the gain of the variable gain amplifiers 5[1], 5[2], . . . 5[n], and supplies this control signal to the gain control circuit 11. The AGC function is obtained through the control of the gain of the variable gain amplifiers 5[1], 5[2], . . . 5[n] by the gain control circuit 11 based on the control signal from the counter circuit 12.

The gain control circuit 11 switches between the control signal from the EVR control circuit 10 and the control signal from the counter circuit 12 based on a control signal from a switching control terminal 11a, and controls the gain of the variable gain amplifiers 5[1], 5[2], . . . 5[n] thereby. Thus an amplifier including an electronic variable resistor is configured.

According to the amplifier configured as described above, an AGC and an electronic variable resistor are included within a circuit, and share a gain control amplifier. Accordingly, the circuit block can be simplified, and the scale of the circuit can be reduced to a size smaller than is possible when the AGC and the electronic variable resistor are configured individually. Moreover, a signal for detecting the output level is handled as a digital signal using the counter circuit 12. This makes it possible to eliminate the external smoothing capacitor.

Furthermore, regardless of whether the AGC function of the variable resistor function is set, a signal always passes through the same amplification circuits 6 between the input terminal 1 and the output terminal 2, while simply the gain changes. Therefore it is possible to suppress DC offset (in the case of audio applications, popping sounds).

Second Embodiment

Figure 2:
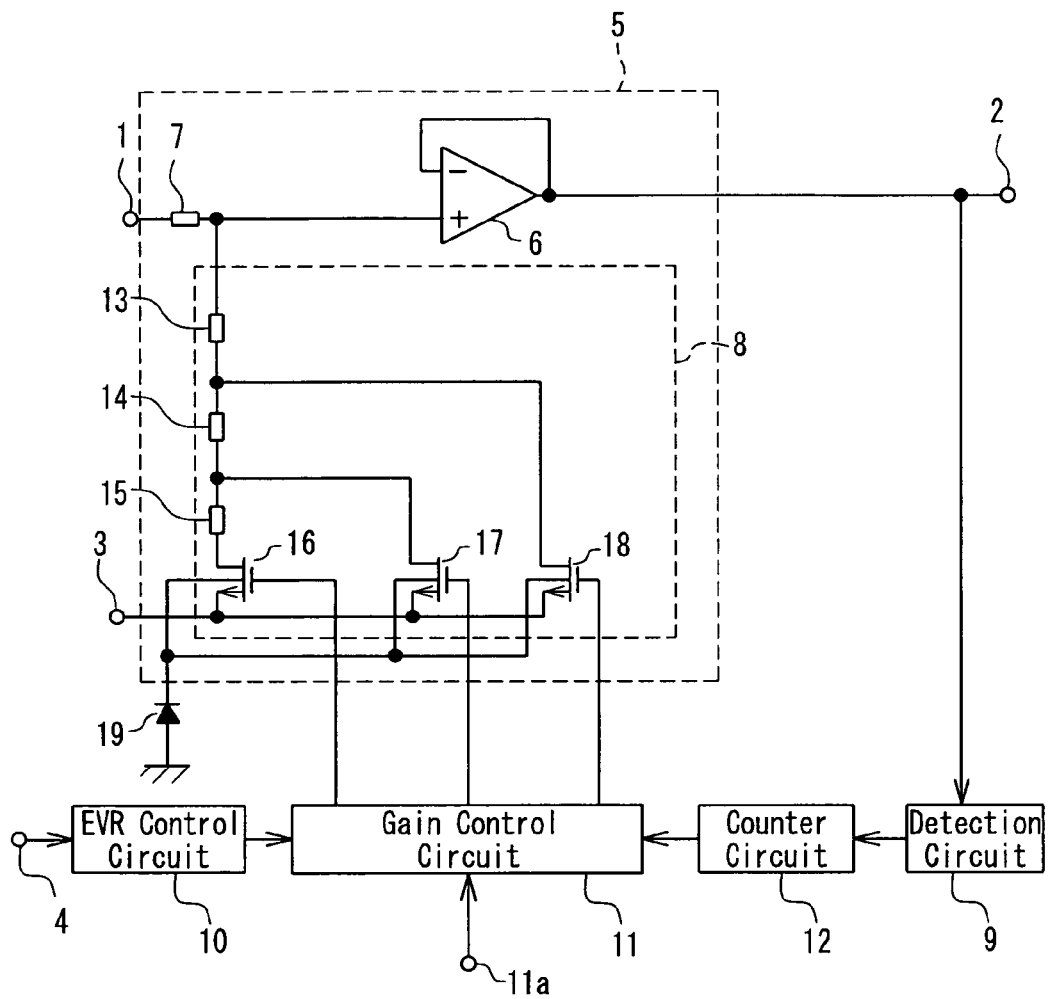
FIG. 2 is a block diagram illustrating an amplifier that includes an AGC and an electronic variable resistor according to a second embodiment of the present invention.

FIG. 2 is a circuit diagram illustrating a configuration of an amplifier according to a second embodiment of the present invention. The amplifier of the present invention has the same basic configuration as that illustrated in FIG. 1; however, here, a single variable gain amplifier 5 is connected between an input terminal 1 and an output terminal 2. The variable gain amplifier 5 is composed of an operational amplifier 6, a resistor 7, and a variable resistor 8. Other circuit elements identical to those shown in FIG. 1 will be given identical reference numerals, and descriptions thereof will not be repeated.

The variable resistor 8 is composed of a series circuit of resistors 13 to 15, NMOS transistors 16 to 18, and a diode 19. One end of the resistor 13 forming one end of the variable resistor 8 is connected to a non-inverting input terminal of the operational amplifier 6. The other end of the series circuit of the resistors 13 to 15, which is the resistor 15, is connected to a reference voltage terminal 3 via the NMOS transistor 16. The node between the resistors 14 and 15 is connected to the reference voltage terminal 3 via the NMOS transistor 17, and the node between the resistors 13 and 14 is connected to the reference voltage terminal 3 via the NMOS transistor 18. The back gates of the NMOS transistors 16 to 18 are grounded via the diode 19.

The gate terminal voltages of the NMOS transistors 16 to 18 are switched to high level or low level by a gain control circuit 11. This changes the resistance value of the variable resistor 8. In other words, by controlling the NMOS transistor 18 to be ON (conductive), the resistance value of the variable resistor 8 is equivalent to the sum of the resistor 13 and an ON-resistance value of the NMOS transistor 18, and providing the minimum resistance value. Furthermore, by controlling the NMOS transistors 17 and 18 to be OFF (non-conductive) and controlling the NMOS transistor 16 to be ON (conductive), the resistance value of the variable resistor 8 is equivalent to the sum of the resistors 13 to 15 and an ON-resistance value of the NMOS transistor 16, providing the maximum resistance value. This is the variance range of the resistance value of the variable resistor 8.

A signal inputted from the input terminal 1 passes through the resistor 7. At this time, the signal inputted into the operational amplifier 6 is attenuated by the resistor 7 and the variable resistor 8. The resistance value of the variable resistor 8 is controlled by the gain control circuit 11, thereby forming the variable gain amplifier 5. By controlling all of the NMOS transistors 16 to 18 to be OFF, an inputted signal can be sent without being attenuated by the variable gain amplifier 5.

A control signal in accordance with the attenuation value or amplification value of the electronic variable resistor outputted by an EVR control circuit 10 is supplied to the gain control circuit 11. The resistance values of the variable resistor 8 are controlled by the output of the gain control circuit 11, and the gain of the variable gain amplifier 5 is controlled thereby. In this manner, the EVR control circuit 10 provides an electronic variable resistor function through the gain control circuit 11.

On the other hand, the signal that has passed through the variable gain amplifier 5 is outputted by the output terminal 2. The signal level of the signal outputted from the output terminal 2 is detected by a detection circuit 9. In accordance with the signal from the detection circuit 9, and based on attack and recovery times preset in the AGC, a control signal for controlling the variable gain amplifier 5 is generated by a counter circuit 12.

Thus the gain control circuit 11 switches between a signal for controlling the attack and recovery operations of the AGC supplied from the counter circuit 12 and a signal for controlling the electronic variable resistor sent from the EVR control circuit 10 so as to obtain the effect of sharing circuit elements and switching between the AGC and electronic variable resistor functions.

As described thus far, the variable resistor 8 is configured simply by switching the gate terminal voltages of the NMOS transistors 16 to 18 between high level and low level, which makes it possible for the gain control of the variable gain amplifier 5 to be carried out using a digital control signal from the gain control circuit 11. Furthermore, since the back gate terminal of the NMOS transistors 16 to 18, which are used as switches, are connected to an open terminal rather than the reference voltage terminal, from which the source voltage is supplied; an operation as a diode is not caused when the input terminal voltage drops below the reference voltage.

The amplifier according to the present embodiment is intended to reduce the scale of the circuit by the configuration such that the AGC circuit and the electronic variable resistor circuit shares the variable gain amplifier, which is a common circuit element. Furthermore, since as a characteristic of the AGC circuit, the signal obtained by detecting the output signal is digitized, the necessity for a smoothing capacitor for the detection signal is eliminated. Thus, simplification can be achieved through the digitization of the counter circuit 12 and the gain control circuit 11. Further still, when the electronic variable resistor function is not selected, the control signal simply may be switched by the gain control circuit 11; accordingly, the operational amplifier 6 continuously operates, and DC offset in the output terminal 2 can be suppressed.

Third Embodiment

Figure 3:
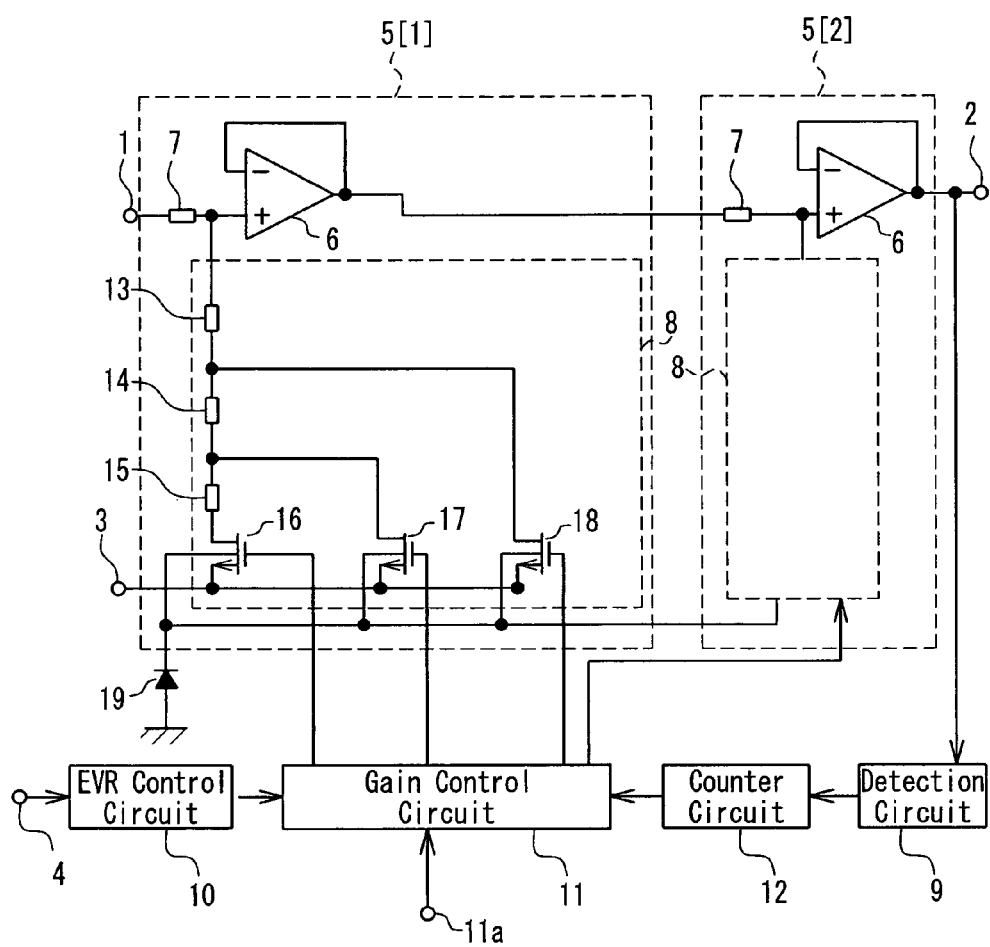
FIG. 3 is a block diagram illustrating an amplifier that includes an AGC and an electronic variable resistor according to a third embodiment of the present invention.

FIG. 3 is a circuit diagram illustrating a configuration of an amplifier according to a third embodiment of the present invention. The amplifier according to the present embodiment is configured so that two variable gain amplifiers, 5[1] and 5[2], are connected in a cascade arrangement between an input terminal 1 and an output terminal 2. The variable gain amplifiers 5[1] and 5[2] are both configured in the same manner as the variable gain amplifier 5 illustrated in FIG. 2, and each comprises an operational amplifier 6, a resistor 7, and a variable resistor 8. Other circuit elements identical to those shown in FIG. 2 will be given identical reference numerals, and descriptions thereof will not be repeated.

The variable resistor 8 comprises resistors 13 to 15, NMOS transistors 16 to 18, and a diode 19. Gain control necessary for the AGC function or the electronic variable resistor function is performed by controlling the variable resistors 8 of each stage independently.

A configuration based on the configuration described above is also possible in the case where three or more variable gain amplifiers are connected in a cascade arrangement. By using multiple-stages of variable gain amplifiers, the number of variable gain options increases, making electronic variable resistor gain control and fine gain control through the AGC function possible.

Fourth Embodiment

Figure 4:
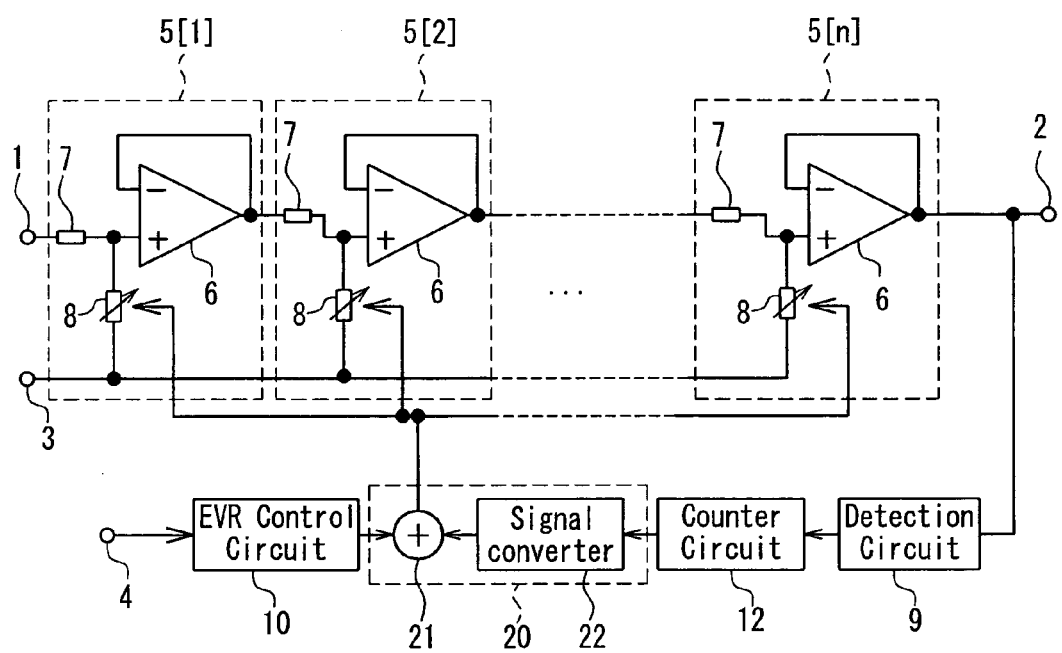
FIG. 4 is a block diagram illustrating an amplifier that includes an AGC and an electronic variable resistor according to a fourth embodiment of the present invention.

FIG. 4 is a block diagram illustrating an amplifier according to a fourth embodiment of the present invention. The amplifier of the present embodiment basically has a similar configuration to that of the amplifier of the first embodiment shown in FIG. 1. The amplifier of the present embodiment is obtained by replacing the configuration, in the first embodiment, for switching the gain control circuit 11 by a signal supplied from the switching control terminal 11a with a gain control circuit 20 composed of a combination of an adder 21 and a signal converter 22.

The signal converter 22 converts a signal from the counter 12 to a gain control signal in order to perform variable gain controlling determined by the counter value. The adder 21 is supplied the controlling signal from the EVR control circuit 10 and the gain controlling signal from the signal converter 22. Since ON/OFF of the AGC function is determined by the detection circuit 9 and the counter circuit 12, AGC operates, when necessary, so as to control automatically the level of the signal outputted from the output terminal 2, even if the gain is changed by the EVR control circuit 10.

Thus the respective gains of the variable gain amplifiers 5[1], 5[2], ... 5[n] are controlled based on the control signals from the EVR control circuit 10 and the counter circuit 12.

With respect to the amplifier of the present embodiment, it is also possible to apply the configuration according to the second or third embodiment so as to obtain the similar effect.

Fifth Embodiment

Figure 5:
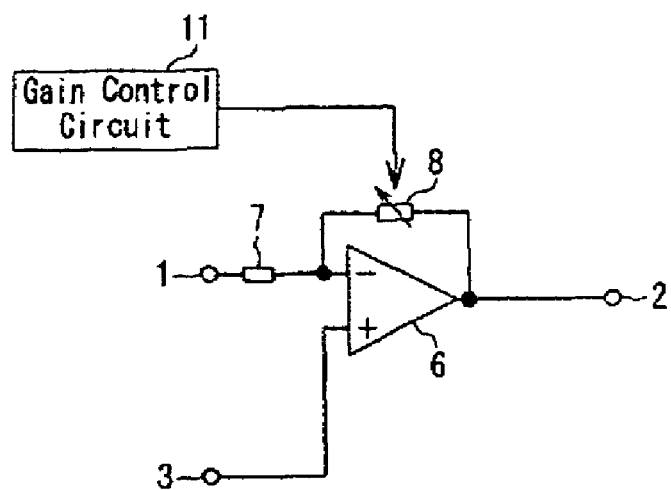
FIG. 5 is a circuit diagram illustrating an variable gain amplifier composing amplifier according to a fifth embodiment of the present invention.
Figure 6:
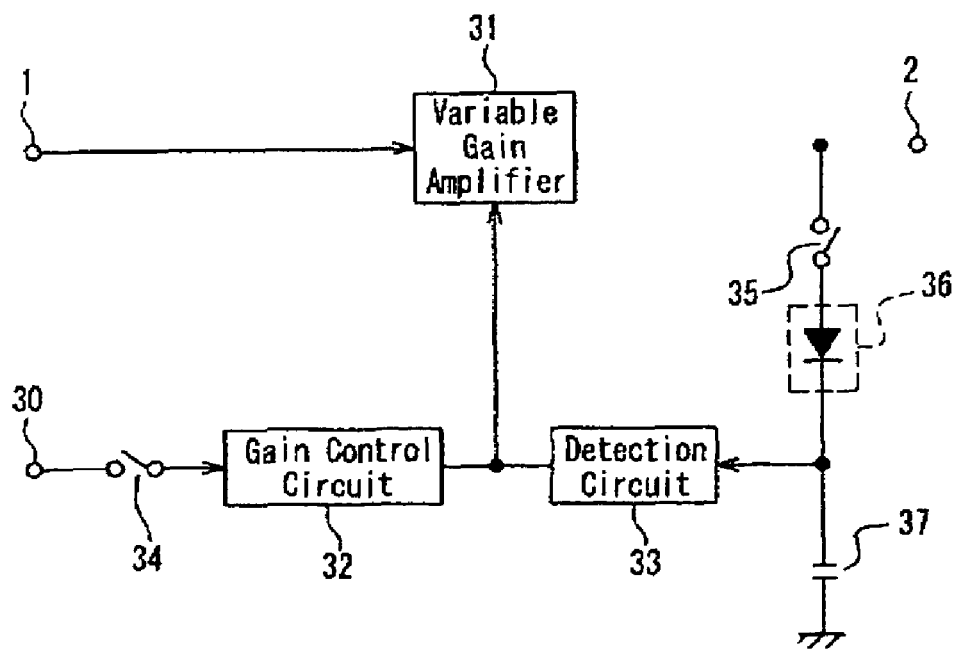
FIG. 6 is a block diagram illustrating a conventional example of an amplifier that includes an AGC and an electronic variable resistor.

FIG. 5 is a circuit diagram illustrating a variable gain amplifier composing amplifier according to a fifth embodiment of the present invention. The variable gain amplifier of the present embodiment has a configuration different from the variable gain amplifier 5 of the above-mentioned embodiments in that the variable resistor 8 is connected to the inverting input terminal.

The input terminal 1 is connected to the inverting input terminal of the operational amplifier 6 via the resistor 7. The output terminal of the operational amplifier 6 is connected to the inverting input terminal via the variable resistor 8. The non-inverting input terminal of the operational amplifier 6 is connected to the reference voltage terminal 3.

When the variable gain amplifiers are used in a multiple stage, they are connected similarly to the first embodiment.

Further, it is possible to apply the configuration shown in FIG. 2 to the variable resistor 8.

What is claimed is:

1. An amplifier comprising:
   a single-stage or multiple-stage variable gain amplifier that amplifies an input signal with a controlled gain;
   an AGC control circuit that detects the peak level of a signal outputted from the variable gain amplifier in the final stage, converts the resultant signal to a digital signal, and outputs an AGC (Automatic Gain Controller) control signal for controlling the gain of the variable gain amplifier based on the converted digital signal;
   an EVR control circuit that outputs an EVR (Electronic Variable Resistor) control signal according to a signal of setting an attenuation value or an amplification value for EVR inputted from an electronic variable resistor control terminal; and
   a gain control circuit that controls the gain of the variable gain amplifier in accordance with at least one of the AGC control signal and the EVR control signal.

2. The amplifier according to claim 1, wherein the gain control circuit switches between the AGC control signal and the EVR control signal in accordance with a switching control signal supplied from outside of the circuit, thereby controlling the gain of the variable gain amplifier in accordance with any one of the signals.

3. The amplifier according to claim 1, wherein the gain control circuit comprises:
   a signal converter that converts the AGC control signal to a gain control signal for controlling the gain of the variable gain amplifier; and
   an adder that adds the gain control signal outputted from the signal converter and the EVR control signal, and
   the gain of the variable gain amplifier is controlled based on a signal obtained by adding the gain control signal and the EVR control signal.

4. The amplifier according to claim 1, wherein the AGC control circuit comprises:
   a detection circuit that detects the peak level of a signal outputted from the variable gain amplifier in the final stage and converts the resultant signal to a digital signal; and
   a counter circuit that outputs the AGC control signal based on the digital signal outputted from the detection circuit.

5. The amplifier according to claim 1, wherein the variable gain amplifier comprises:
   an operational amplifier in which a non-inverting input terminal is supplied with the input signal via a resistor; and
   a variable resistor that is connected at one terminal to the non-inverting input terminal and is connected at the other terminal to a reference voltage terminal, and
   an inverting input terminal of the operational amplifier is connected to an output terminal thereof, so that the gain is controlled by the ratio of resistance values of the resistor and the variable resistor.

6. The amplifier according to claim 5, wherein the variable resistor comprises:
   a series circuit of plural resistors; and
   switching transistors, each of which is connected at one terminal to one of nodes between the respective resistors of the series circuit and is connected at the other terminal to one end of the series circuit, and
   the gain control circuit controls switching of ON and OFF of each of the switching transistors.

7. The amplifier according to claim 6, wherein the back gates of the switching transistors are grounded via a diode.

8. The amplifier according to claim 1, wherein the variable gain amplifier comprises: an operational amplifier in which an inverting input terminal is supplied with the input signal via a resistor and a non-inverting input terminal is connected to a reference voltage terminal; and a variable resistor that is connected between the inverting input terminal and an output terminal, so that the gain is controlled by the ratio of resistance values of the resistor and the variable resistor.

9. The amplifier according to claim 8, wherein the variable resistor comprises: a series circuit of plural resistors; and switching transistors, each of which is connected at one terminal to one of nodes between the respective resistors of the series circuit and is connected at the other terminal to one end of the series circuit, and the gain control circuit controls switching of ON and OFF of each of the switching transistors.

10. The amplifier according to claim 9, wherein the back gates of the switching transistors are grounded via a diode.

11. The amplifier according to claim 1, wherein plural variable gain amplifiers are connected in a cascade arrangement, and the gain of each of the variable gain amplifiers can be controlled independently.

* * * * *